(12) United States Patent
Higdon et al.

(10) Patent No.: US 6,251,501 B1
(45) Date of Patent: Jun. 26, 2001

(54) SURFACE MOUNT CIRCUIT DEVICE AND SOLDER BUMPING METHOD THEREFOR

(75) Inventors: William David Higdon, Greentown; Shing Yeh, Kokomo, both of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/280,946

(22) Filed: Mar. 29, 1999

(51) Int. Cl.$^7$ .................................................. B32B 3/00
(52) U.S. Cl. ..................... 428/209; 428/212; 428/213; 257/772; 438/612; 438/653; 438/654; 438/656
(58) Field of Search ..................... 428/209, 212, 428/213, 901; 257/750, 751, 753, 762–763, 764, 766–772, 774; 438/612, 653, 654, 656

(56) References Cited

U.S. PATENT DOCUMENTS

| | | | | |
|---|---|---|---|---|
| 5,508,229 | * | 4/1996 | Baker ................................... | 437/183 |
| 5,803,340 | * | 9/1998 | Yeh et al. ............................ | 228/56.3 |
| 6,011,313 | * | 1/2000 | Shangguan et al. ................ | 257/778 |
| 6,062,461 | * | 5/2000 | Sparks et al. ...................... | 228/123.1 |

* cited by examiner

Primary Examiner—Deborah Jones
Assistant Examiner—Bryant Young
(74) Attorney, Agent, or Firm—Jimmy L. Funke

(57) ABSTRACT

A solder bumping method and structure for producing fine-pitch solder bump and which eliminate conventional process compatibility requirements for under bump metallurgy (UBM) and solder bump formation. The method generally entails forming an input/output pad on the surface of a semiconductor device, and then forming a metal layer on the input/output pad that will serve as the UBM of the solder bump. A plating seed layer is then formed on the UBM and on the surrounding surface of the device, after which a mask is formed on the plating seed layer and a via is formed in the mask to expose a portion of the plating seed layer overlying the UBM, and preferably portions of the plating seed layer not overlying the UBM. A solder material is then deposited on the portion of the plating seed layer exposed within the via. Because the via is not limited by the size of the UBM, the deposited solder material is able to cover an area larger than the metal layer, thereby increasing the amount of solder material available to form the solder bump without requiring a thicker mask.

20 Claims, 1 Drawing Sheet

SURFACE MOUNT CIRCUIT DEVICE AND SOLDER BUMPING METHOD THEREFOR

TECHNICAL FIELD

The present invention generally relates to surface mount (SM) circuit devices. More particularly, this invention relates to a solder bumping method for a surface mount device, which includes plating a solder material on a plating seed layer covering an under bump metallurgy (UBM).

BACKGROUND OF THE INVENTION

Surface mount (SM) semiconductor devices such as flip chips typically include an integrated circuit and bead-like terminals formed on one of their surfaces. The terminals are typically in the form of solder bumps near the edges of the chip, and serve to both secure the chip to a circuit board and electrically interconnect the flip chip circuitry to a conductor pattern on the circuit board. The circuit board may be a ceramic substrate, printed wiring board, flexible circuit or silicon substrate, though other substrates are possible. Due to the numerous functions typically performed by the microcircuitry of a semiconductor device, a relatively large number of solder bumps are required. The size of a typical flip chip is generally on the order of a few millimeters per side, resulting in the solder bumps being crowded along the edges of the chip.

Because of the narrow spacing required for the solder bumps and their conductors, soldering a flip chip or other SM semiconductor device to a conductor pattern requires a significant degree of precision. Reflow solder techniques are widely employed for this purpose, and entail precisely depositing a controlled quantity of solder on the bond pads of the chip using methods such as electrodeposition and printing. Once deposited, heating the solder above its liquidus temperature serves to form the characteristic spherical-shaped solder bumps on the pads. After cooling to solidify the solder bumps, the chip is soldered to the conductor pattern by registering the solder bumps with their respective conductors and then reheating, or reflowing, the solder so as to form solder bump connections that metallurgically adhere to the conductors.

Flip chip input/output pads are electrically interconnected with the circuitry on the flip chip through vias. Because aluminum metallization is typically used in the fabrication of integrated circuits, input/output pads are typically aluminum or aluminum alloy, which are generally unsolderable and susceptible to corrosion if left exposed. Consequently, bond pads are often formed to include the aluminum input/output pad and one or more additional metal layers that promote wetting and metallurgical bonding with solder bump alloys. These additional metal layers, or under bump metallurgy (UBM), may be, for example, electroless nickel and a top layer of gold that will readily wet and bond with typical tin-lead solder alloys. Another suitable UBM composition has a multilayer structure that includes an adhesion-promoting layer, a diffusion barrier layer, and a solderable layer. The adhesion layer may be aluminum or another metal composition that will bond to the underlying aluminum input/output pad. Copper is readily solderable, i.e., can be wetted by and will metallurgically bond with solder alloys of the type used for solder bumps, and therefore is a common choice for the solderable (top) layer of the UBM. The diffusion barrier layer is typically a nickel-vanadium or chromium-copper alloy, and is disposed between the adhesion and solderable layers to inhibit diffusion between the solder and aluminum pad. A NiV and CrCu layer also serves as a wettable layer if an overlaying copper layer is dissolved into the solder.

Placement of the chip and reflow of the solder must be precisely controlled not only to coincide with the spacing of the bond pads and the conductors to which the solder bumps are registered and reflow soldered, but also to control the height of the solder bump connections after reflow. As is well known in the art, controlling the height of solder bump connections after reflow is often necessary to prevent the surface tension of the molten solder from drawing the flip chip excessively close to the substrate during the reflow operation. Sufficient spacing between the chip and its substrate, often termed the "stand-off height," is desirable for enabling stress relief during thermal cycles, allowing penetration of cleaning solutions for removing undesirable processing residues, and enabling the penetration of mechanical bonding and encapsulation materials between the chip and its substrate.

Control of solder bump position, height and pitch are dictated in part by the manner in which the solder is deposited on the bond pads. One known technique is to use a photoimagable dry film as a stencil for printing a solder paste on the bond pads of a flip chip. The location and size of the solder bumps are determined by the vias in the dry film, which contain the solder during reflow. With relatively large bump spacings and conventional solders, this process is reliable and cost effective. However, for relatively fine pitches, vias can be difficult to form in a dry film, and it is difficult to get a uniform distribution of solder paste into a small via. Finally, solder compositions that can be used with this method are limited to those with reflow temperatures at or below the maximum temperature the dry film material can withstand and still be removed after reflow.

Finer solder bump pitches can generally be obtained with plating methods. One such technique involves depositing metal films on the semiconductor wafer, forming a plating mask, electroplating a minibump of a solderable material, electroplating a layer of solder, and then removing the mask and the exposed metal films. The minibump and that portion of the metal film remaining beneath the solder serve as a UBM. A disadvantage to this approach is that chemistries used to remove the metal film between solder bumps must be compatible with and not degrade the bumps.

From the above it can be seen that, while fine solder bump pitches can be attained by plating techniques, process and material compatibilities between UBM formation, solder bump formation and reliability are limitations. Accordingly, it would be desirable if an improved method were available for forming fine-pitch solder bumps on flip chips and other SM semiconductor devices that employ solder bumps.

SUMMARY OF THE INVENTION

According to this invention, a solder bumping method and structure are provided that achieve fine solder bump pitches and eliminates conventional process compatibility requirements for UBM and solder bump formation. The method generally entails forming an input/output pad on the surface of a semiconductor device, and then forming a metal layer on the input/output pad that will serve as the UBM of the solder bump. A plating seed layer is then formed on the UBM and on the surrounding surface of the device, after which a mask is formed on the plating seed layer and a via is formed in the mask to expose a portion of the plating seed layer overlying the UBM, and preferably portions of the plating seed layer not overlying the UBM. A solder material is then deposited on the portion of the plating seed layer exposed within the via. Because the via is not limited by the size of the UBM, the deposited solder material is able to cover an area larger than the metal layer, thereby increasing the amount of solder material available to form the solder bump.

The result of the above process is a semiconductor device having input/output pads covered by a UBM, a plating seed layer on the UBM and on the surrounding surface of the device, a mask having a via that exposes a portion of the plating seed layer, including that which overlies the UBM, and solder material on the plating seed layer within the via. At this point, the mask and that portion of the plating seed layer not covered by the solder material can be removed using the solder material as a mask. The solder material can then be reflowed to form the solder bump, causing the remaining portion of the plating seed layer to dissolve into the solder bump.

From the above, it can be seen that the solder bump structure and process of this invention provide for a UBM that can be specifically formulated to promote the reliability of the resulting solder connection formed by the solder bump, without concern for process compatibility with the solder bump. Due to the presence of the plating seed layer, the UBM does not dictate the manner in which the solder material is deposited or the amount of solder material deposited, and therefore does not dictate the size of the solder bump formed by the solder material. Instead, the plating seed layer enables the mask to determine the amount of solder material that can be deposited, and the removal of the plating seed layer around the UBM after deposition of the solder material does not damage the UBM or diminish its ability to promote solder connection reliability.

Other objects and advantages of this invention will be better appreciated from the following detailed description.

DESCRIPTION OF THE PREFERRED EMBODIMENT

Figure 1:
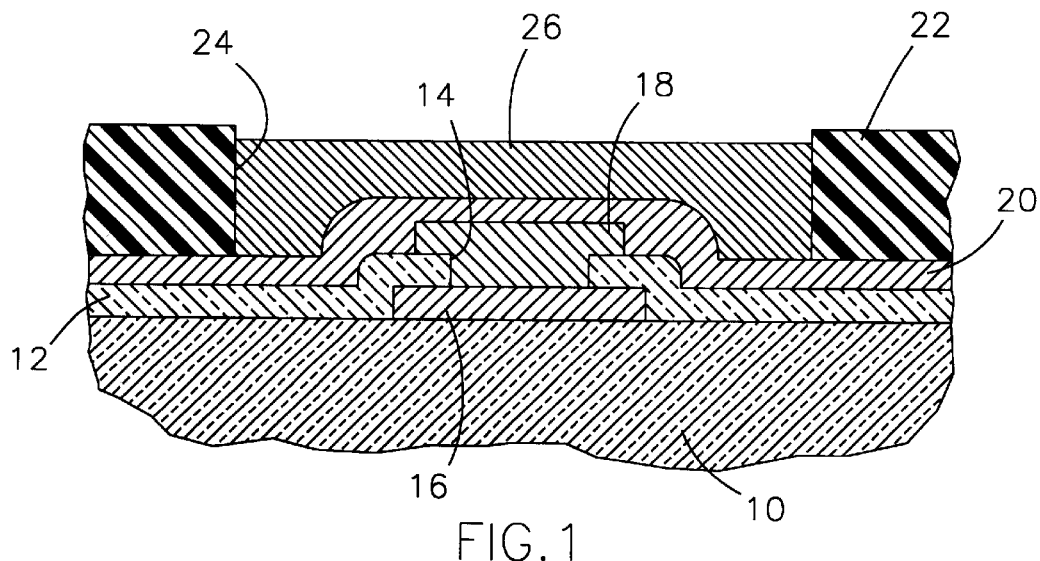
FIGS. 1 through 3 represent processing steps for forming a solder bump in accordance with the present invention.
Figure 2:
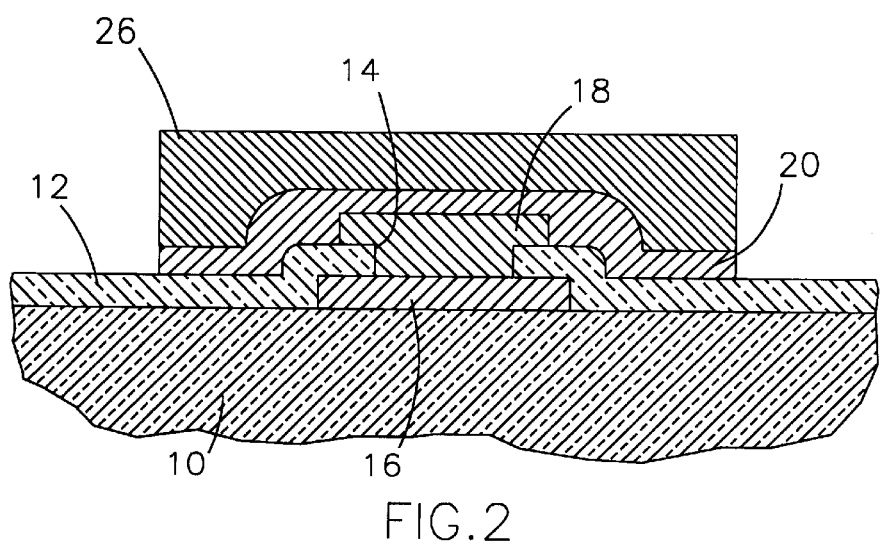
Figure 3:
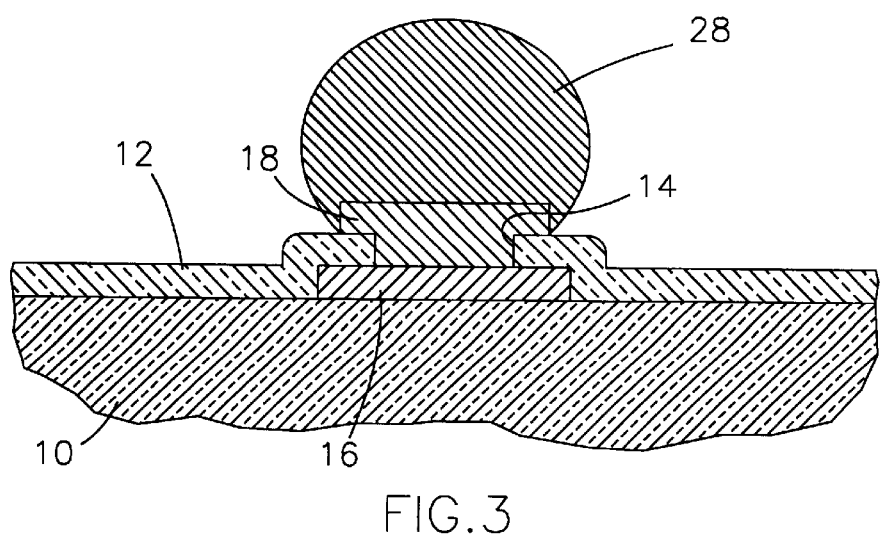

FIGS. 1 through 3 represent partial cross-sectional views of a flip chip 10 or other surface mount semiconductor circuit device at different process levels of the present invention. As illustrated, the chip 10 includes a passivation layer 12 that is conventionally present to protect the underlying surface of the chip 10 from environmental contaminants, moisture and electrical shorts. The passivation layer 12 is typically silicon dioxide, though silicon nitride, polyimides, phosphosilicated glass (PSG), borophosphosilicated glass (BPSG), and Dow Chemical's CYCLOTENE may also be used. Exposed by an opening 14 in the passivation layer 12 is a portion of an input/output pad 16. The pad 16 can be conventionally formed of aluminum or an aluminum-base alloy, and is therefore generally unsolderable and susceptible to corrosion if left exposed.

Covering the pad 16 is a UBM 18 that provides a solderable surface for a mass of solder 26 shown in FIGS. 1 and 2. The UBM 18 can be a combination of thin films or a short bump either electroplated or formed of electroless nickel in accordance with prior art practices. In a preferred embodiment, the UBM 18 is formed to include an adhesion layer, a diffusion barrier layer, and a solderable layer. Suitable adhesion layer materials include aluminum, titanium, chromium and tungsten, which directly contact and metallurgically bond to the input/output pad 16. Suitable solderable layer materials include copper and gold, while suitable materials for the diffusion barrier layer include nickel-vanadium, chromium-copper and palladium. The diffusion barrier layer is between the adhesion and solderable layers to reduce solid state diffusion between the UBM 18 and a solder bump 28 (FIG. 3) formed from the solder 26. Particularly suitable combinations for the adhesion, diffusion barrier and solderable layers of the UBM 18 are, respectively: aluminum, nickel-vanadium and copper; titanium, nickel-vanadium and copper; chromium, chromium-copper, copper and gold; titanium, palladium and gold; and titanium-tungsten, nickel-vanadium and copper. A suitable thickness for the UBM 18 is about one to about two micrometers, though greater and lesser thicknesses are possible. A minibump (not shown) could also be formed as part of the UBM 18, with the resulting UBM having a thickness of about ten to fifteen micrometers.

The UBM 18 is patterned to define the area that serves as the solderable contact of the chip 10. The process used to pattern the UBM 18 is completed prior to the deposition of the solder 26 and formation of the solder bump 28. According to this invention, an additional layer of metal is deposited on the chip 10 so as to be between the UBM 18 and solder 26, as shown in FIG. 1. For reasons to become apparent below, this metal layer, termed herein the plating seed layer 20, covers at least the UBM 18 and preferably a portion of the surface of the chip 10 surrounding the UBM 18, as shown in FIG. 1. As a matter of processing convenience, the seed layer 20 is preferably deposited by a vacuum deposition process such as sputtering or evaporation to cover the entire surface of the chip 10. Suitable materials for the seed layer 20 include copper, silver and any other materials that can be easily plated and alloyed with the solder alloy desired for the solder bump 28. As will be explained below, preferred materials for the seed layer 20 are soluble in the solder alloy.

A plating mask 22 is then applied to the chip 10, and a via 24 is defined in the mask 22 to expose a portion of the seed layer 20 over the UBM 18. The mask 22 is preferably formed of a photoimagable material that meets the feature definition and thickness requirements for the solder plating process, such that a desired amount of solder 26 can be appropriately deposited on the seed layer 20 above the UBM 18. A suitable photoimagable material for this purpose a positive photoresist available from Hoechst Celanese under the name AZP4620.

After the mask 22 has been imaged and the via 24 developed in accordance with known practices, solder 26 is plated onto the exposed portion of the seed layer 20, as shown in FIG. 1. During the plating process, the seed layer 20 serves as a plating seed conductor to the solder alloy being deposited. Suitable plating processes and baths are known to those skilled in the art, and therefore will not be discussed in any detail here. The minimum thickness for the seed layer 20 is determined by its electrical resistance across the chip 10. The resistance must be sufficiently low so that the voltage drop due to the current going away from the current contact is low compared to the voltage drop between the wafer surface and the plating solution. As a result, the entire wafer surface is substantially at the same potential so that the plated thickness will be uniform. The maximum thickness for the seed layer 20 is determined by how much of the seed layer 20 can be dissolved into the solder 26 during reflow. The entire seed layer 20 must be dissolved into the solder 26 by the time the solder 26 has coalesced into a sphere. Based on the above, the thickness of the seed layer 20 is preferably in the range of about 0.15 to about 0.25 micrometer.

As can be seen from FIG. 1, the via 24 can have a different size and shape than the UBM 18 because the solder 26 is plated onto the seed layer 20, which completely covers the UBM 18. In the prior art, the size of the UBM 18 and resist thickness would have dictated the amount of solder 26 that can be deposited by plating. With this invention, the presence of the seed layer 20 enables the amount of solder 26 to be deposited, and therefore the size of the solder bump 28, to be free of the conventional limitations imposed by the UBM 18. Therefore, a notable advantage of this invention is that the area of the plated solder 26 can be significantly larger than the UBM 18, so that greater solder volumes and solder bump heights can be obtained for a given photoresist thickness by simply increasing the size of the via 24. Advantages of larger solder bumps achieved with this invention include improved reliability and increased stand-off between the chip 10 and the surface to which the chip 10 is eventually attached, which facilitates underfilling of the chip 10.

After depositing the solder 26, the mask 22 and that portion of the seed layer 20 not covered by the solder 26 are removed, as portrayed in FIG. 2. The seed layer 20 can be removed without damaging the solder 26 by oxidizing the seed layer 20 and then etching the resulting oxide. For example, a copper seed layer 20 can be oxidized and removed with a solution of about 1% hydrogen peroxide and about 1% sulfuric acid in water between room temperature and about 50 C. It is foreseeable that other etchants and processes could be used to remove the seed layer 20.

According to known practices, the solder 26 is then reflowed, during which the solder 26 melts and coalesces to form the spherical-shaped solder bump 28, which is attached to the chip 10 only at the UBM 18 as shown in FIG. 3. Because the mask 22 is not present during reflow, solder compositions that can be used to form the solder bump 28 are not limited to those with reflow temperatures at or below the maximum temperature the mask 22 can withstand and still be removed after reflow. Accordingly, tin-lead solder alloys of any composition, as well as any other solder alloy that can be plated and will also dissolve a seed layer during reflow, can be used with this invention.

As indicated in FIG. 3, the seed layer 20 preferably dissolves into the solder alloy during reflow, necessitating that the seed layer 20 is formed of a material that is soluble in the solder alloy. Because of its minimal thickness, the seed layer 20 becomes a low level component of the solder alloy. Copper and silver are preferred for the seed layer 20 because each is soluble in tin-lead solder alloys and can serve to enhance certain properties of the solder connection eventually formed by the solder bump 28. For example, copper and silver contents of up to about 1% and about 2%, respectively, in a tin-lead solder alloy can enhance resistance to electromigration, adhesion, and mechanical properties such as tensile strength and creep resistance.

While the invention has been described in terms of a preferred embodiment, it is apparent that other forms could be adopted by one skilled in the art. Accordingly, the scope of the invention is to be limited only by the following claims.

What is claimed is:

1. A structure comprising:
   an input/output pad on a surface;
   a metal layer on the input/output pad;
   a plating seed layer having a first portion on the metal layer and a second portion not on the metal layer, the first and second portions of the plating seed layer having a combined surface area greater than the metal layer;
   a mask on the plating seed layer, the mask having a via therein that exposes the first portion of the plating seed layer overlying the metal layer and the second portion of the plating seed layer not overlying the metal layer; and
   a solder material within the via and overlying the first and second portions of the plating seed layer, the solder material within the via covering a surface area larger than the metal layer.

2. A structure as recited in claim 1, wherein the plating seed layer is a metal selected from the group consisting of copper and silver, and has a thickness of about 0.15 to about 0.25 micrometer.

3. A structure as recited in claim 1, wherein the plating seed layer has a third portion not on the metal layer, the mask covering the third portion of the plating seed layer so that the solder material does not overlie the third portion.

4. A structure as recited in claim 3, wherein the second portion of the plating seed layer surrounds the first portion of the plating seed layer, and the third portion of the plating seed layer surrounds the first and second portions of the plating seed layer.

5. A structure as recited in claim 1, further comprising a passivation layer on the surface, the passivation layer having an opening therein that exposes a portion of the input/output pad, the metal layer overlaying and contacting the portion of the input/output pad exposed by the opening in the passivation layer.

6. A structure as recited in claim 1, wherein the metal layer is a multilayer structure comprising an adhesion layer, a diffusion barrier layer, and a solderable layer.

7. A structure as recited in claim 6, wherein the adhesion layer is one or more metals selected from the group consisting of aluminum, titanium, chromium and tungsten, the adhesion layer being on and contacting the input/output pad.

8. A structure as recited in claim 6, wherein the diffusion barrier layer is selected from the group consisting of nickel-vanadium, chromium-copper and palladium, the diffusion barrier layer being on and contacting the adhesion layer.

9. A structure as recited in claim 6, wherein the solderable layer is copper and/or gold, and the solderable layer is on and contacts the diffusion barrier layer.

10. A structure as recited in claim 1, wherein the surface is on a surface mount circuit device.

11. A method comprising the steps of:
    forming an input/output pad on a surface;
    forming a metal layer on the input/output pad;
    forming a plating seed layer having a first portion on the metal layer and a second portion not on the metal layer, the first and second portions of the plating seed layer having a combined surface area greater than the metal layer;
    forming a mask on the plating seed layer, the mask having a via therein that exposes the first portion of the plating seed layer overlying the metal layer and the second portion of the plating seed layer not overlying the metal layer; and then
    depositing a solder material on the first and second portions of the plating seed layer within the via, the solder material within the via covering a surface area larger than the metal layer.

12. A method as recited in claim 11, wherein the plating seed layer is a metal selected from the group consisting of copper and silver, and has a thickness of about 0.15 to about 0.25 micrometer.

13. A method as recited in claim 11, wherein the plating seed layer further has a third portion not on the metal layer and the mask is formed to cover the third portion of the plating seed layer so that the solder material does not overlie the third portion of the plating seed layer, the method further comprising the step of removing the mask and the third portion of the plating seed layer.

14. A method as recited in claim 13, further comprising the step of reflowing the solder material so as to form a solder bump and so as to dissolve the first and second portions of the plating seed layer into the solder bump.

15. A method as recited in claim 11, wherein the surface comprises a passivation layer, the passivation layer having an opening therein that exposes a portion of the input/output pad, and the metal layer is deposited so as to overlay and contact the portion of the input/output pad exposed by the opening in the passivation layer.

16. A method as recited in claim 11, wherein the metal layer is formed to have a multilayer structure comprising an adhesion layer, a diffusion barrier layer, and a solderable layer.

17. A method as recited in claim 16, wherein the adhesion layer is one or more metals selected from the group consisting of aluminum, titanium, chromium and tungsten, the adhesion layer being on and contacting the input/output pad.

18. A method as recited in claim 16, wherein the diffusion barrier layer is selected from the group consisting of nickel-vanadium, chromium-copper and palladium, the diffusion barrier layer being on and contacting the adhesion layer.

19. A method as recited in claim 16, wherein the solderable layer is copper and/or gold and is on and contacts the diffusion barrier layer.

20. A method of forming a solder bump on a surface of a surface mount circuit device, the method comprising the steps of:

forming an input/output pad on the surface of the device;

forming a passivation layer on the surface of the device;
  forming an opening in the passivation layer that exposes at least a portion of the input/output pad;

depositing a metal composition on the portion of the input/output pad within the opening in the passivation layer, the metal composition comprising at least a solderable layer;

depositing a plating seed layer on the solderable layer and the passivation layer;

forming a mask on the plating seed layer;

forming a via in the mask that exposes a first portion of the plating seed layer overlying the solderable layer, the via being larger than the solderable layer such that the via also exposes a second portion of the plating seed layer overlying the passivation layer, the mask covering a third portion of the plating seed layer;

plating a solder material on the first and second portions of the plating seed layer within the via, the plating seed layer serving as a plating seed conductor to the solder material;

removing the mask;

removing the third portion of the plating seed layer not covered by the solder material; and then reflowing the solder material so as to form a solder bump and so as to dissolve the first and second portions of the plating seed layer into the solder bump.

* * * * *